(12) United States Patent
Maehara et al.

(10) Patent No.: US 7,652,852 B2
(45) Date of Patent: Jan. 26, 2010

(54) MAGNETORESISTANCE EFFECT DEVICE AND A PREFORM THEREFOR

(75) Inventors: Hiroki Maehara, Tokyo (JP); Tomoaki Osada, Tokyo (JP); Mihoko Doi, Tokyo (JP); Koji Tsunekawa, Tokyo (JP); Naoki Watanabe, Tokyo (JP)

(73) Assignee: Canon Anelva Corporation, Tokyo (JP)

( * ) Notice: Subject to any disclaimer, the term of this patent is extended or adjusted under 35 U.S.C. 154(b) by 478 days.

(21) Appl. No.: 11/161,675

(22) Filed: Aug. 11, 2005

(65) Prior Publication Data

US 2006/0038246 A1 Feb. 23, 2006

(30) Foreign Application Priority Data

Aug. 20, 2004 (JP) ............................. 2004-240838

(51) Int. Cl.
*G11B 5/39* (2006.01)
*G11B 5/127* (2006.01)

(52) U.S. Cl. ................. 360/313; 428/811.2; 428/811.5; 428/814; 428/815

(58) Field of Classification Search ....................... None
See application file for complete search history.

(56) References Cited

U.S. PATENT DOCUMENTS

| | | | | |
|---|---|---|---|---|
| 6,303,218 | B1 * | 10/2001 | Kamiguchi et al. | 428/332 |
| 6,452,385 | B1 | 9/2002 | Shimazawa et al. | |
| 6,462,919 | B1 * | 10/2002 | Mack et al. | 360/327.3 |
| 6,821,451 | B2 | 11/2004 | Hattori | |
| 7,190,557 | B2 * | 3/2007 | Li et al. | 360/324.1 |
| 2002/0038681 | A1 | 4/2002 | Nakatani et al. | |
| 2003/0030944 | A1 * | 2/2003 | Lin et al. | 360/324.1 |
| 2003/0128484 | A1 * | 7/2003 | Noma | 360/324.12 |
| 2005/0135004 | A1 * | 6/2005 | Lee et al. | 360/122 |
| 2007/0119811 | A1 | 5/2007 | Nakatani et al. | |

(Continued)

FOREIGN PATENT DOCUMENTS

JP 11-092971 4/1999

(Continued)

OTHER PUBLICATIONS

Translation of Office Action issued in corresponding Japanese Patent Application No. 2004-240888, dated Mar. 17, 2008.

(Continued)

*Primary Examiner*—Kevin M Bernatz
(74) *Attorney, Agent, or Firm*—Buchanan Ingersoll & Rooney PC

(57) ABSTRACT

A method of production of a magnetoresistance effect device is able to prevent or minimize a drop in the MR ratio and maintain the high performance of the magnetoresistance effect device even if forming an oxide layer as a surface-most layer constituting a protective layer by the oxidation process inevitably included in the process of production of microprocessing by dry etching performed in a vacuum. Two mask layers used for microprocessing are doubly piled up. This method of production of a magnetoresistivity effect device including a magnetic multilayer film including at least two magnetic layers includes a step of providing under a first mask material that is a nonorganic material a second mask material able to react with other atoms to form a conductive substance, and a device made according to the method.

4 Claims, 5 Drawing Sheets

U.S. PATENT DOCUMENTS

2008/0217289 A1  9/2008  Maehara et al.

FOREIGN PATENT DOCUMENTS

| JP | 2000-228003 | 8/2000 |
| JP | 2001-028442 | 1/2001 |
| JP | 2001-274144 | 10/2001 |
| JP | 2002-038285 | 2/2002 |
| JP | 2002-109707 | 4/2002 |
| JP | 2003-198008 | 7/2003 |
| JP | 2004-146552 | 5/2004 |

OTHER PUBLICATIONS

A Japanese Office Action issued in corresponding Japanese Patent Application No. 2004-240888, and translation thereof.

Office Action dated Apr. 1, 2009 issued in U.S. Appl. No. 12/117,753.

English-language translation of the Office Action issued in Japanese Patent Application No. 2008-290569.

An English language translation of an Office Action issued in corresponding Japanese Patent Application No. 2008-290569, mailed Sep. 29, 2009.

* cited by examiner

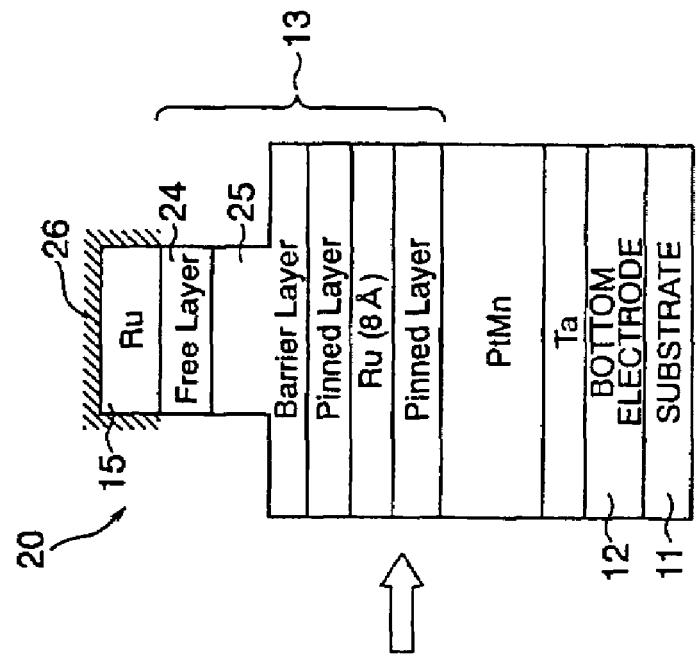
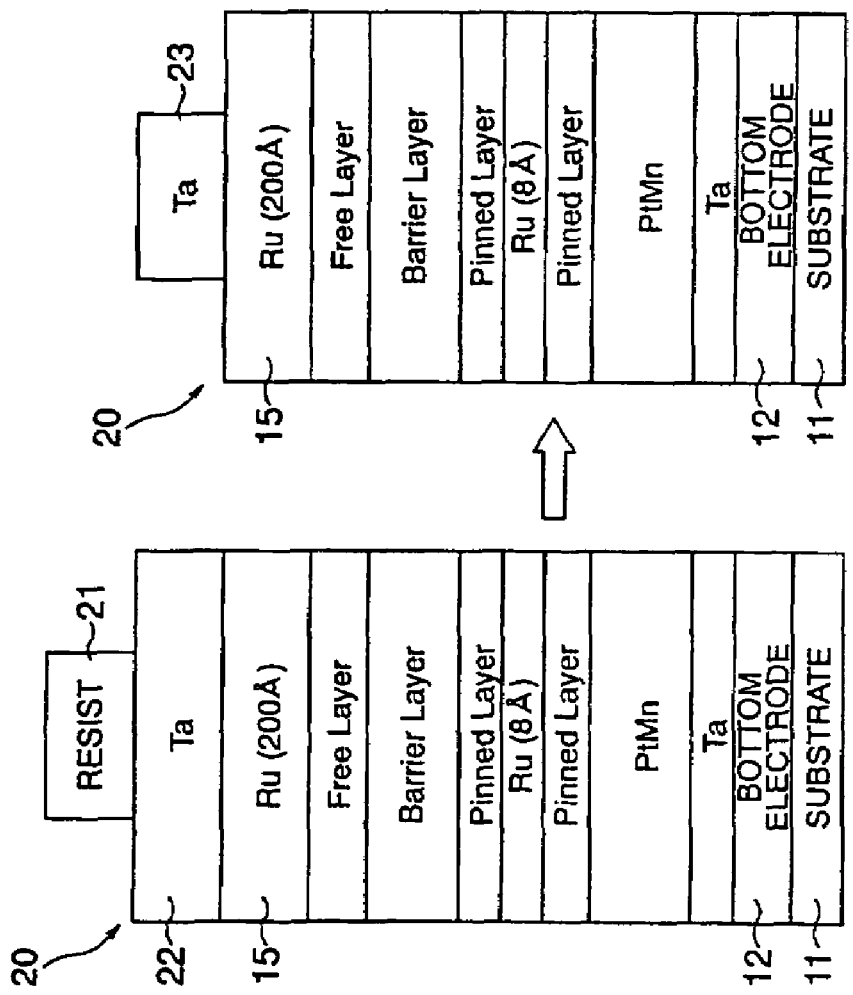

FIG. 3A

⟨OXIDE⟩ RESISTIVITY [Ωm]

| | |
|---|---|
| $RuO_2$ | $2.0 \times 10^{-7}$ |
| $RhO_2$ | $<10^{-6}$ |
| $OsO_2$ | $6.0 \times 10^{-7}$ |
| NbO | $7.0 \times 10^{-7}$ |
| $IrO_2$ | $5 \times 10^{-7}$ |
| $PtO_2$ | $6 \times 10^{-6}$ |
| $ReO_3$ | $1 \times 10^{-7}$ |

FIG. 3B

⟨METAL⟩ RESISTIVITY [Ωm]

| | |
|---|---|
| GOLD Au | $2.05 \times 10^{-8}$ |
| SILVER Ag | $1.47 < 10^{-8}$ |
| COPPER Cu | $1.72 \times 10^{-8}$ |
| ALUMINUM Al | $2.50 \times 10^{-8}$ |
| TANTALUM Ta | $1.23 \times 10^{-7}$ |
| IRIDIUM Ir | $4.6 \times 10^{-8}$ |
| OSMIUM Os | $8.1 \times 10^{-8}$ |
| RHODIUM Rh | $4.3 \times 10^{-8}$ |
| PLATINUM Pt | $9.8 \times 10^{-8}$ |
| RUTHENIUM Ru | $7.5 \times 10^{-8}$ |

FIG. 4

| MATERIAL OF PROTECTIVE LAYER (ELECTRODE) | MR RATIO (%) |
|---|---|
| Ru | 38 |
| Ta | 13 |

LOW RESISTANCE (Rmin)

HIGH RESISTANCE (Rmax)

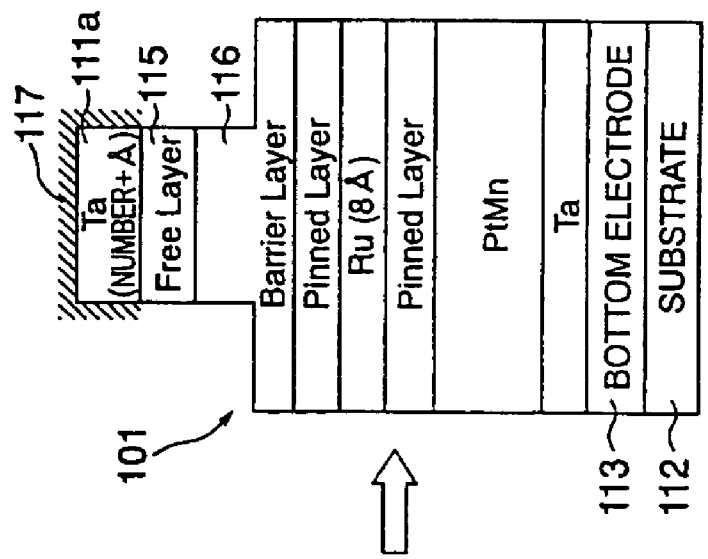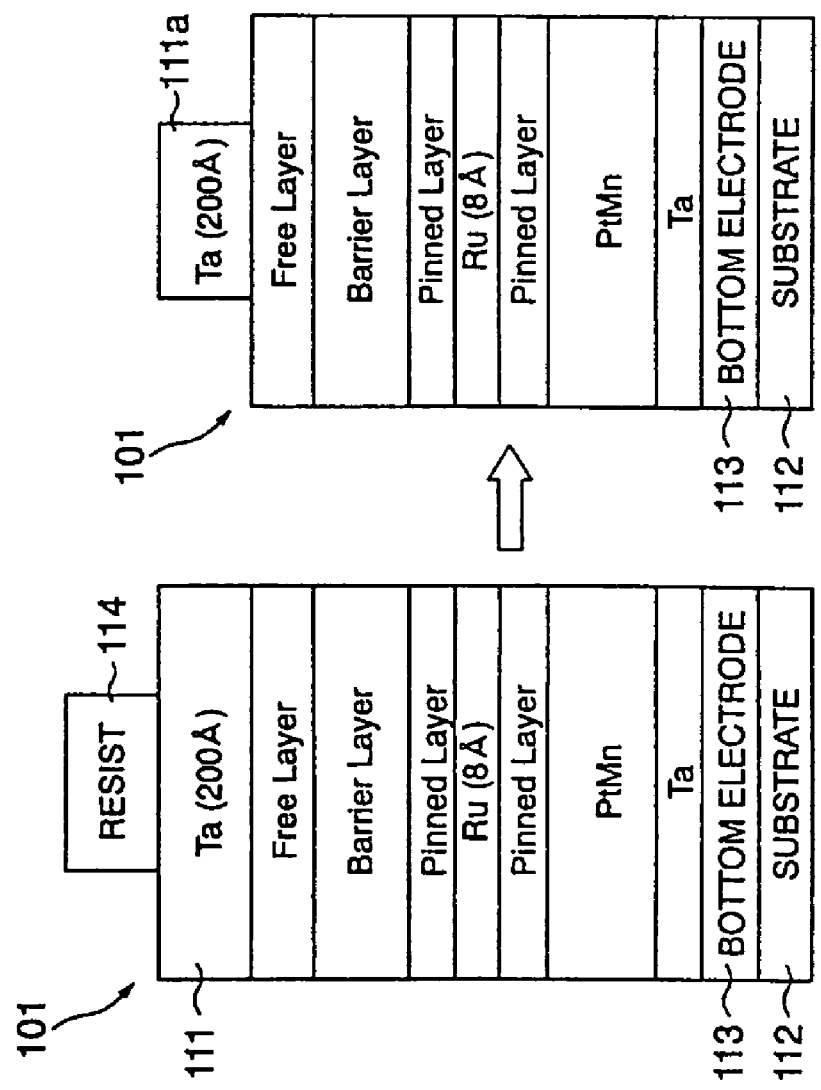

MAGNETORESISTANCE EFFECT DEVICE AND A PREFORM THEREFOR

BACKGROUND OF THE INVENTION

1. Field of the Invention

The present invention relates to a method of production of a magnetoresistance effect device, more particularly, relates to a method of production of a magnetoresistance effect device suitable for preventing a drop in a magnetoresistance ratio.

2. Description of the Related Art

Magnetic random access memories (MRAMs) are integrated circuit magnetic memories that is now paid attention as memories having integration densities on a par with dynamic random access memories (DRAMs), featuring high speed performance on a par with static random access memories (SRAMs), and enabling unlimited rewriting. The magnetic random access memories and magnetic heads are mainly comprised of layers of nonmagnetic or magnetic thin films of several nm (nanometer) thickness giving a tunneling magnetoresistive (TMR) effect. This configuration with the TMR effect is hereinafter referred to as "TMR devices".

Further, each of the plurality of magnetic films forming a TMR device is formed by sputtering. The insulation layer is formed utilizing an oxidation reaction of a metal.

The basic structure of a TMR device is shown in FIG. 5. A TMR device 101 is basically comprised, as explained above, of an insulation layer 102 sandwiched at its two sides by ferromagnetic layers 103 and 104. Arrows 103a and 104a show the directions of magnetization of the ferromagnetic layers 103 and 104, respectively. FIGS. 6A and 6B are used for explaining the state of resistance in the TMR device 101 when applying a voltage V to the TMR device 101 by a DC power source 105. The TMR device 101 has the feature of changing in resistance in accordance with the states of magnetization of the ferromagnetic layers 103 and 104 due to the DC voltage V applied from the DC power source 105. Further, as shown in FIG. 6A, when the directions of magnetization of the ferromagnetic layers 103 and 104 are the same, the resistance value of the TMR device 101 becomes minimum, while as shown in FIG. 6B, when the directions of magnetization of the ferromagnetic layers 103 and 104 are opposite, the resistance value of the TMR device becomes maximum. The minimum resistance of the TMR device is indicated by "$R_{min}$", while the maximum resistance of the TMR device 101 is indicated by "$R_{max}$". Here, in general, there are a "current-in-plane" (CIP) structure sending a sense current in parallel to the plane of the device film and a "current perpendicular to plane" (CPP) type sending a sense current in a direction perpendicular to the plane of the device film. FIG. 5 and FIGS. 6A and 6B show an example of a CPP type magnetoresistance effect device.

A "MR ratio (magnetoresistance ratio)" is defined for the above TMR device 101 as follows:

$$MR\ \text{ratio}=(R_{max}-R_{min})/R_{min} \quad (1)$$

Next, the conventional method of production and problems of a TMR device having the above multilayer structure and resistance characteristics will be explained from the viewpoint of the deterioration of the MR ratio.

A magnetoresistance effect device like a TMR device built into an MRAM or magnetic head is microprocessed in the process of production. For example, when etching the magnetic layers forming the TMR device, an etching gas of a mixed gas of carbon monoxide and a nitrogen compound (for example, $NH_3$: ammonia) ($CO+NH_3$) or an alcohol-based etching gas including hydroxy groups ($CH_3OH$) etc. is used. At this time, if using a resist mask made of an organic material for the etching, no selectivity can be obtained and microprocessing is not possible, so the practice has been to use tantalum (Ta), titanium (Ti), etc. giving selectivity with respect to the magnetic layers as a hard mask and etch by reactive ion etching (RIE) etc. In particular, Ta is originally used as a thin film material forming part of a TMR device and has the advantage that it can be deposited by the sputtering method in the same step as another magnetic material (see Japanese Patent No. 3131595, Japanese Patent Publication (A) No. 2002-38285, and Japanese Patent Publication (A) No. 2001-274144).

However, if using Ta, Ti, etc. as a hard mask for etching by the above-mentioned gases, the oxygen contained in the gases reacts with the surface of the hard mask to form oxide films at the surface-most layer of the hard mask. This state will be explained with reference to FIGS. 7A to 7C. FIGS. 7A to 7C show the conventional process of dry etching of the TMR device 101 provided with a Ta layer 111 as the layer forming the hard mask. In the TMR device 101, in particular reference numeral 112 shows a substrate and 113a bottom electrode.

In FIGS. 7A to 7C, the resist 114 is used to etch the Ta layer 111 to form a hard mask of the Ta layer 111. In the state of FIG. 7B, as a result, a hard mask 111a made of the Ta layer 111 is formed. In FIG. 7B, the hard mask 111a of the Ta layer 111 is used for etching the layers forming the TMR device. At this time, the above-mentioned gases are used. In FIG. 7C, an example of the state where the TMR device 101 is etched using the hard mask 111a of the Ta layer 111 is shown. In this example, the free layer 115 and barrier layer 116 are etched and the hard mask 111a of the Ta layer 111 is left at a thickness of tens of Å on the free layer 115.

In the conventional dry etching method explained above, finally the hard mask 111a of the Ta layer 111 is left as a surface layer at the topmost layer of the TMR device 101. After this, the TMR device 101 finished being microprocessed in the vacuum dry etching apparatus is taken out of the dry etching apparatus, that is, is exposed to the air. Therefore, the TMR device 101 is placed in an environment in contact with oxygen contained in the air. Accordingly, by not removing all of the Ta layer used as the hard mask in the etching, but leaving some of it, this is given the role of a protective layer protecting the magnetic layers from oxidation etc. As a result, the surface-most layer of the remaining hard mask 111a of the Ta layer 111 inevitably reacts with the oxygen in the air in the step of transfer from the vacuum microprocessing to the air, even if not using an etching gas containing oxygen atoms as explained above, and forms an oxide film (or oxide layer) 117 at the surface-most layer where the hard mask contacts the oxygen.

However, if the oxide film 117 is formed at the surface-most layer of the hard mask 111a of the Ta layer 111, the oxide film 117 becomes an insulation layer. If the insulation layer is formed at the surface-most layer of the TMR device 101, a parasitic resistance ends up being formed, so the above-mentioned MR ratio falls. This drop in the MR ratio is more striking with a TMR device of the CPP type, that is, the type shown in FIGS. 7A to 7C, sending a sense current in a direction perpendicular to the plane of the device film, compared with the CIP type sending a sense current in a direction parallel to the plane of the device film. Therefore, it is necessary to remove the oxide film 117 at the surface-most layer of the hard layer 111a of the Ta layer 111 to prevent a drop in the MR ratio, but as explained above, it is necessary to protect the free layer 115 from oxygen in the air when transferring the TMR device finished being microprocessed by etching to the outside of the dry etching apparatus. This problem similarly occurs when using Ti as a hard mask instead of Ta.

The TMR device after microprocessing is exposed once to the air, then transferred to the next step of production for forming electrodes etc.

Further, as related art of the present invention, there are the thin film device and method of production of the same disclosed in Japanese Patent Publication (A) No. 2001-28442. The thin film device and method of production of this publication relate to a magnetic head and a method of production of a magnetic head and mainly has as its object formation of lead electrodes by highly selective dry etching without damaging (etching) the GMR.

OBJECTS AND SUMMARY

It is an object of the present invention to prevent the hard mask left as the protective layer after the microprocessing by dry etching from being oxidized in the conventional method of production of a TMR device or other magnetoresistance effect device and as a result an insulation layer being formed and a drop and deterioration of the MR ratio being caused.

An object of the present invention is to provide a method of production of a magnetoresistance effect device able to prevent or minimize a drop in the MR ratio and maintain the high performance of the magnetoresistance effect device even if forming an oxide layer as a surface-most layer constituting a protective layer by the oxidation process inevitably included in the process of production of microprocessing of dry etching performed in a vacuum, without making any special changes to the process of production, by doubly piling up two mask layers used for microprocessing. That is, an object of the present invention is to provide a method of production of a magnetoresistance effect device capable of positively utilizing the protective layer with the oxide layer formed through the production process as a layer formed by conductive oxide substance.

A method of production of a magnetoresistance effect device is configured as follows for achieving the above object.

The method of production of the magnetoresistance effect device is a method of dry etching used for production of a magnetoresistance effect device comprised of a magnetic multilayer film including at least two magnetic layers. This method comprises a step of providing under a first mask material comprised of a nonorganic material a second mask material able to react with other atoms to form a conductive substance so that the first and second mask materials make layers which are doubly piled up.

Among the above-mentioned magnetoresistance effect devices, in a TMR device sending a sense current in a direction perpendicular to the plane of the device film, when the surface-most layer of the protective layer reacts with for example oxygen atoms in the process of microprocessing by this dry etching apparatus, by using a material which does not form an insulator, but can form a conductor so as to form a protective layer, it is possible to prevent or minimize a drop in the MR ratio and for example maintain the high performance of the MRAM, magnetic head, etc. formed by the TMR device.

Preferably, the second mask material is a material able to react with Oxygen atoms to form a conductive oxide.

More preferably, the second mask material able to form a conductive oxide is one of Ru (ruthenium), Rh (rhodium), Os (osmium), Nb (niobium), Ir (iridium), and Re (rhenium).

Still more preferably, the method further comprises a step of removing the first mask material by an etching gas including oxygen atoms to change the surface of the second mask material to the conductive oxide, and leaving the second mask material to form an electrode.

Still more preferably, the etching gas including oxygen atoms is a mixed gas of carbon monoxide and a nitrogen compound or an alcohol-based gas including at least one hydroxy group.

An embodiment of the present invention takes effect as follows. When microprocessing a TMR device or other magnetoresistance effect device used as a MRAM or magnetic head etc. by dry etching, since the second mask layer is a material which can form a conductive substance, the second mask layer not completely removed, but remains after the first mask material is completely etched away and forms an electrode serving also as a protective layer, so a good sense current is obtained and a high MR ratio can be obtained.

Further, according to an embodiment of the present invention, by forming the second mask material by Ru or another material able to form a conductive oxide, it is possible to completely remove the first mask material in microprocessing by reactive ion etching (RIE) using a predetermined etching gas and not completely remove the second mask material under it but leave it as a protective layer and thereby make the surface-most layer a conductive oxide. It is possible to use this as it is as an electrode. Due to this, it is possible to eliminate the film-forming step of again forming an electrode after microprocessing the magnetic material forming the magnetoresistance effect device.

BRIEF DESCRIPTION OF THE DRAWINGS

These and other objects and features of the present invention will become clearer from the following description of the preferred embodiments given with reference to the attached drawings, wherein:

FIGS. 2A to 2C are transition diagrams showing a dry etching process in a process of production of a magnetoresistance effect device according to an embodiment of the present invention;

FIG. 3A shows a table showing the resistivities of conductive oxides;

FIG. 3B shows a table showing the resistivities of single metals;

FIG. 4 is a view, obtained by experimental results, comparing the MR ratio between the case of using a protective layer of Ru of an embodiment of the present invention and the case of using Ta of the related art;

FIGS. 7A to 7C are transition diagrams showing a dry etching process in a process of production of a magnetoresistance effect device according to the related art and explaining problems in the same.

DESCRIPTION OF THE PREFERRED EMBODIMENTS

Hereinafter, preferred embodiments of the present invention will be explained in accordance with the attached drawings.

Figure 1A:
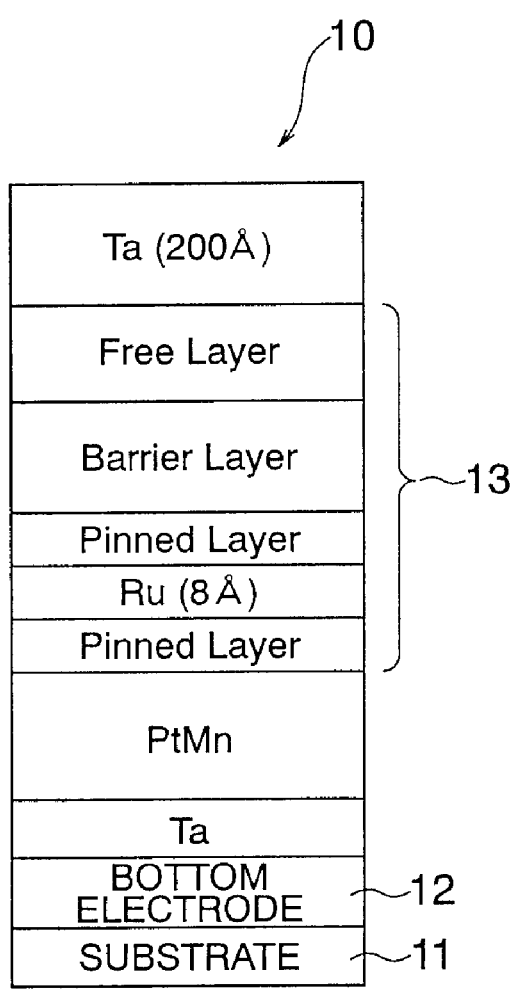
FIG. 1A is a structural view of a multilayer film showing an example of the structure of a conventional magnetoresistance effect device.
Figure 1B:
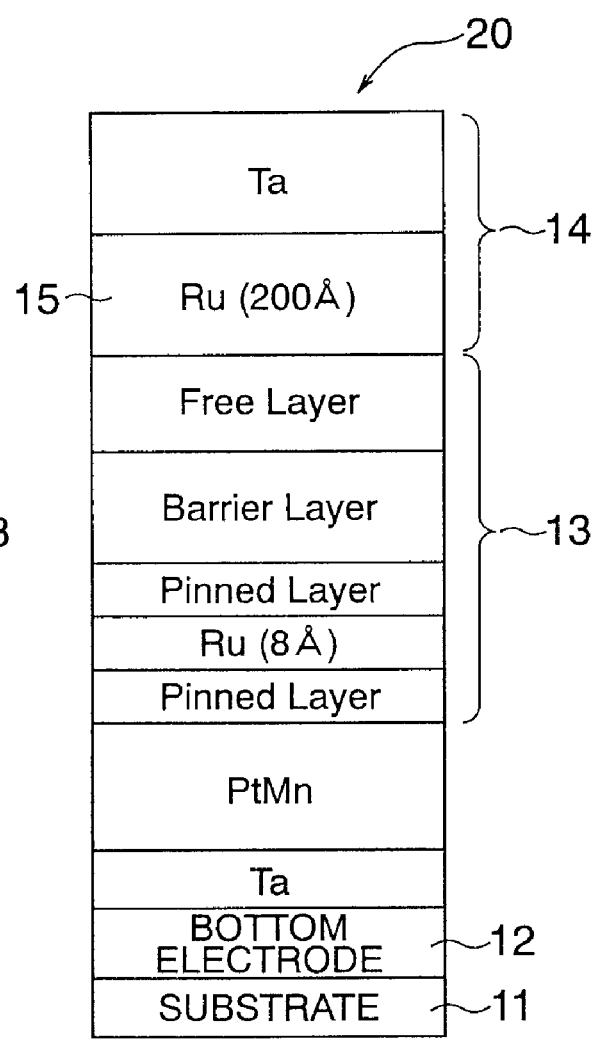
FIG. 1B is a structural view of a multilayer film showing an example of the structure of a magnetoresistance effect device according to an embodiment of the present invention.
Figure 5:
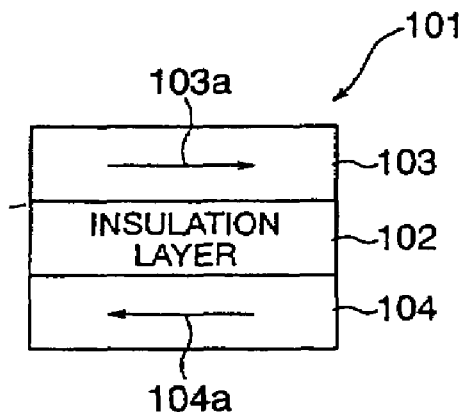
FIG. 5 is a longitudinal cross-sectional view showing the basic structure of A TMR device of related art.
Figure 6A:
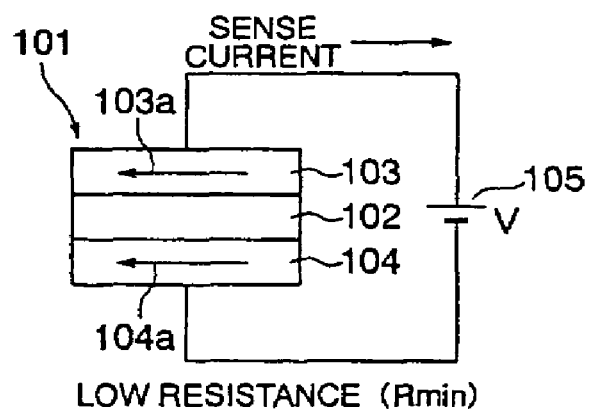
FIG. 6A is a view explaining the change of resistivity in the conventional TMR device.
Figure 6B:
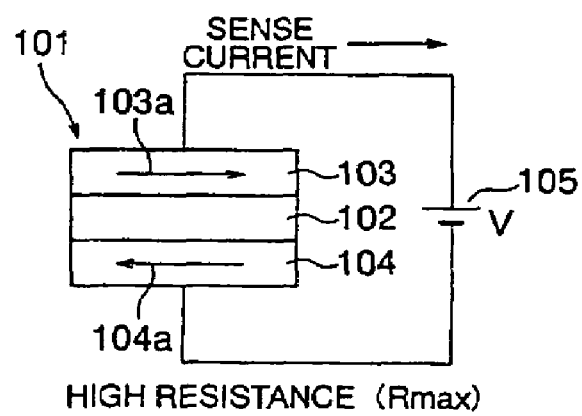
FIG. 6B is a view explaining the change of resistivity in a conventional TMR device.

FIG. 1A shows an example of the structure of a magnetoresistance effect device (TMR device) in a conventional production process (microprocessing step), and FIG. 1B shows, in comparison, an example of the structure according to an embodiment of the present invention.

In the example of the structure of a conventional magnetoresistance effect device (TMR device) 10 shown in FIG. 1A, a substrate 11 is formed with a bottom electrode 12. The bottom electrode 12 is formed with a multilayer film comprised of eight layers forming the magnetoresistance effect device. This eight-layer multilayer film is comprised, from the bottommost first layer to the topmost eighth layer, magnetic layers piled up or deposited in the order of "Ta", "PtMn", "a pinned layer", "Ru", "another pinned layer", "a barrier layer", "a free layer", and "Ta". The first layer (Ta) is the bottom layer, the second layer (PtMn) is an antiferromagnetic layer, the third layer to the fifth layer (pinned layer, Ru, and pinned layer) are pinned magnetization layers, the sixth layer (barrier layer) is an insulation layer, the seventh layer (free layer) is free magnetization layer, and the eighth layer (Ta) is a hard mask forming a protective layer. The pinned magnetization layers, the insulation layer, and the free layer form an MR device portion 13.

In the example of the structure of a magnetoresistance effect device 20 according to an embodiment of the present invention (FIG. 1B), a substrate 11 is formed with a bottom electrode 12. The bottom electrode 12 is formed with a multilayer film comprised of nine layers forming a magnetoresistance effect device. This nine-layer multilayer film is comprised, from the bottommost first layer to the topmost ninth layer, of magnetic layers piled up or deposited in the order of "Ta", "PtMn", "a pinned layer", "Ru", "a pinned layer", "a barrier layer", "a free layer", "Ru (200 Å)", and "Ta". The first layer to the seventh layer and the ninth layer are the same in configuration as in the multilayer structure of the conventional magnetoresistance effect device (FIG. 1A) explained above. That is, the first layer (Ta) is the primer layer, the second layer (PtMn) is an antiferromagnetic layer, the third layer to the fifth layer (pinned layer, Ru, and pinned layer) are pinned magnetization layers, the sixth layer (barrier layer) is an insulation layer, the seventh layer (free layer) is a free magnetization layer, and the ninth layer (Ta) is a hard mask forming a protective layer. In this magnetoresistance effect device, the Ta of the topmost ninth layer is used as a hard mask, a TMR device portion 13 is formed by the pinned magnetizations, insulation layer and free layer, and a magnetic head cap 14 is formed by the eighth layer (Ru) and ninth layer (Ta). The magnetoresistance effect device of this embodiment of the present invention includes the insertion, between the seventh layer (free layer) and ninth layer (Ta), of the Ru (ruthenium) layer 15 as a protective layer able to be used as an electrode. The thickness of the Ru layer of the protective layer 15 is 200 Å, for example.

Next, the dry etching process performed in a vacuum in the process of production of the magnetoresistance effect device 20 shown in FIG. 1B will be explained with reference to FIGS. 2A to 2C. As the etching apparatus, an ICP plasma apparatus having a one-turn antenna is used, the antenna is connected to a plasma high frequency power source for the supply of high frequency power (hereinafter referred to as "source power"), and the object being etched, that is, the wafer on which the TMR device portion is patterned, is supplied with a self bias voltage (hereinafter referred to as the "bias power").

In the state shown in FIG. 2A, the topmost layer of the Ta layer 22 is etched using the resist 21 as a mask so as to create a hard mask (first mask material) of the Ta layer 22. The etching conditions include an internal pressure of the vacuum vessel of the processing chamber of 0.8 Pa, a source power of 500 W, a bias power of 70 W, an etching gas of $CF_4$, and a flow rate of 50 sccm (326 mg/min). In the state shown in FIG. 2B, as a result, a first mask layer of a Ta layer constituting the hard mask 23 is formed. In FIG. 2B, next, the Ta layer of the hard mask 23 is used to etch part of the TMR device 13 for example. At this time, as the etching gas, for example, a mixed gas of carbon monoxide and a nitrogen compound ($CO+NH_3$) or an alcohol-based etching gas including a hydroxy group ($CH_3OH$) is used. The etching conditions when using a mixed gas of CO and $NH_3$ as an etching gas include an internal pressure of the vacuum vessel of the processing chamber of 0.6 Pa, a source power of 1000 W, a bias power of 300 W, a flow rate of CO gas as the etching gas of 25 sccm (31.25 mg/min), and a flow rate of $NH_3$ gas of 75 sccm (57.0 mg/min). When using $CH_3OH$ gas as the etching gas, the conditions include an Internal pressure of the vacuum vessel of the processing chamber of 0.4 Pa, a source power of 1000 W, a bias power of 200 W, and a flow rate of etching gas of 15 sccm (18.75 mg/min). In FIG. 2C, an example is shown of the state in which the TMR device portion 13 has been etched. In this example, after the free layer 24 and insulator (barrier layer) 25 are etched and the TMR device is etched, or when the TMR device is etched, the hard mask 23 of Ta is removed. Thereby, the Ru layer 15 is exposed as the surface-most layer on the free layer 24.

That is, since the selectivity of Ru with respect to Ta is about 10, when the thickness of the Ru layer of the protective layer 15 is for example 200 Å, the Ta (hard mask) of the first layer is made about 20 Å so as not to leave the hard mask (Ta) when continuing etching using the Ru layer as the second mask material. The dry etching process is ended leaving a thickness of the Ru layer 15 of tens of Å required for functioning as a protective layer.

Note that in accordance with the above dry etching process, in the process of the states shown in FIG. 2B to FIG. 2C, the above etching process is sometimes performed down to the layer of Ta on the bottom electrode 12 (selectivity with respect to Ru free layer, barrier layer, and pinned layers is about 1 to 4).

Here, in the dry etching process from the state of FIG. 2B to the state of FIG. 2C, there are two methods for removing the hard mask 23 of Ta. The first method of removal is the method of preadjusting the thickness of the hard mask 23 so that the hard mask 23 is completely removed when the etching ends when etching the TMR device as explained above. The second method of removal is a method of not adjusting the thickness, but performing the processing for completely removing the hard mask 23 after ending the etching of the TMR device.

In the process of production of the magnetoresistance effect device 20, After the dry etching process introducing oxygen into the etching gases shown in FIGS. 2A to 2C, the magnetoresistance effect device 20 is exposed to the air, and the oxygen atoms in the air react with the surface of the layer of Ru of the second mask material 15 to form the layer of the oxide 26 (oxide film). This oxide 26 becomes a conductive oxide due to the characteristics of the Ru.

The tables of FIG. 3A and FIG. 3B show respectively the resistivities (Ωm) Of the conductive oxides and the resistivities (Ωm) of metals alone. As shown in FIGS. 3A and 3B, the conductive oxide of Ru, that is, $RuO_2$, has a resistivity substantially the same as the metal Ta alone.

Therefore, if using Ru as the second mask material 15 in the dry etching process of the TMR device of the magnetoresistance effect device 20 and finally completely removing the Ta of the first mask 23, there is the advantage that a layer of a conductive insulator 26 is formed at the surface-most layer in the process of production and the cause of the drop in the MR ratio explained above can be removed. FIG. 4 shows a comparison of the MR ratio characteristic when using magnetoresistance effect devices of the same configuration from the substrate to the TMR device as in FIGS. 1A and 1B between the case of using Ta for the surface-most layer becoming the protective layer after etching and the case of making the Ru become the protective layer after etching as in the embodiment of the present invention. The etching conditions, as explained in the embodiment of FIGS. 2A to 2C, may be the conditions of the case of use of either a mixed gas of carbon monoxide and a nitrogen compound ($CO+NH_3$) or an alcohol-based etching gas including a hydroxy group ($CH_3OH$), but they are made so that after etching, the thicknesses of the Ta and Ru remaining as the "free layer" protective layer on the TMR device become substantially the same (here 20-30 Å). As being clear by the comparison table shown in FIG. 4, the MR ratio when using the Ru of the second mask material as the protective layer is about three times as many as the MR ratio when using the Ta instead.

Further, by finally completely removing the Ta of the first mask material 23 in the dry etching process of the TMR device of the magnetoresistance effect device 20, a layer of a conductive oxide 26 is formed at the surface-most layer in the process of production, so the layer of the conductive oxide 26 can be used as a top electrode. Therefore, there is the advantage that it is no longer required to provide a step for forming the top electrode, which was required in the conventional production process.

As explained above, in the dry etching process of a TMR device in the process of production of the magnetoresistance effect device 20, the second mask material 15 of the magnetic head used is the material Ru able to react with oxygen atoms to form a conductive oxide, so the technical effect is exhibited of preventing or minimizing the drop in the MR ratio and enabling the top electrode to be replaced with a conductive oxide.

As other materials having similar characteristics as the above Ru, Rh (rhodium), Os (osmium), Nb (niobium), Ir (iridium), and Re (rhenium) may be mentioned. As described in the second row on of the table of FIG. 3A, the oxides Rh, Os, Nb, Ir, and Re, that is, $RhO_2$, $OsO_2$, NbO, $IrO_2$, and $ReO_3$ also have sufficient conductivity. Note that FIG. 3B shows a table of the resistivities of metals having conductivity for comparison.

Note that in the explanation of the above embodiment, an example of a material able to react with oxygen atoms to form a conductive oxide was explained, but of course it is also possible to similarly apply the basic thinking of the present invention to a material able to form a nitride or carbide having conductivity.

The configurations, shapes, sizes (thicknesses), and layouts explained in the above embodiments are only shown schematically to an extent enabling the present invention to be understood and worked. Further, the numerical values and compositions (materials) are only shown for illustration. Therefore, the present invention is not limited to the explained embodiments and can be changed in various ways within the scope of the technical idea shown in the claims.

Further, as the etching apparatus, a helicon type apparatus called a "high density plasma source", a two-frequency excitation parallel plate type plasma apparatus, a microwave type plasma apparatus, etc. may be utilized.

One object of the present invention is to prevent or minimize a drop in the MR ratio in the production of a TMR device or other magnetoresistance effect device.

The present disclosure relates to subject matter contained in Japanese Patent Application No. 2004-240838 filed on Aug. 20, 2004, the disclosure of which is expressly incorporated herein by reference in its entirety.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A CPP (current perpendicular to the plane) magnetoresistance effect device comprising:
    a substrate;
    pinned magnetization layers positioned over the substrate;
    a barrier layer formed on the pinned magnetization layers, which barrier layer is an insulation layer;
    a free magnetization layer formed on the barrier layer; and
    a protective layer formed on the free magnetization layer;
    wherein the protective layer comprises a metal layer; and a metal oxide layer positioned on the metal layer and made by oxidation of the metal layer so that the metal oxide layer covers a top surface and a side surface of the metal layer, whose resistivity is $6 \times 10^{-6}$ Ωm or less, and the protective layer is a surface-most layer that is adapted to function as a top electrode for the magnetoresistance effect device.

2. The magnetoresistance effective device as set forth in claim 1, wherein the metal oxide layer is an oxide of Ru.

3. The magnetoresistance effective device as set forth in claim 1, wherein a bottom electrode is positioned below the free magnetization layer, and the device is able to pass an electric current between the bottom electrode and the top electrode.

4. The magnetoresistance effective device as set forth in claim 1, wherein thickness of the protective layer is 20-30 Å.

* * * * *

UNITED STATES PATENT AND TRADEMARK OFFICE
CERTIFICATE OF CORRECTION

PATENT NO.      : 7,652,852 B2
APPLICATION NO. : 11/161675
DATED           : January 26, 2010
INVENTOR(S)     : Maehara et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 816 days.

Signed and Sealed this

Twenty-third Day of November, 2010

David J. Kappos
*Director of the United States Patent and Trademark Office*